United States Patent
Wang

(10) Patent No.: US 11,817,166 B2
(45) Date of Patent: Nov. 14, 2023

(54) MEMORY, MEMORY TEST SYSTEM, AND MEMORY TEST METHOD

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/650,317

(22) Filed: Feb. 8, 2022

(65) Prior Publication Data
US 2022/0165345 A1 May 26, 2022

Related U.S. Application Data

(63) Continuation of application No. PCT/CN2021/112344, filed on Aug. 12, 2021.

(30) Foreign Application Priority Data

Oct. 27, 2020 (CN) .......................... 202011166903.9

(51) Int. Cl.
*G11C 29/12* (2006.01)
*G11C 29/14* (2006.01)
*G11C 29/36* (2006.01)

(52) U.S. Cl.
CPC .... *G11C 29/12015* (2013.01); *G11C 29/1201* (2013.01); *G11C 29/14* (2013.01); *G11C 29/36* (2013.01); *G11C 2029/3602* (2013.01)

(58) Field of Classification Search
CPC .......... G11C 29/12015; G11C 29/1201; G11C 29/14; G11C 29/36
See application file for complete search history.

(56) References Cited

U.S. PATENT DOCUMENTS

| | | | |
|---|---|---|---|
| 6,675,312 B1 * | 1/2004 | Baker | G06F 1/08 |
| | | | 713/501 |
| 9,270,285 B2 * | 2/2016 | Kang | G11C 29/12015 |
| 2003/0112696 A1 * | 6/2003 | Lee | G11C 7/225 |
| | | | 365/233.1 |
| 2004/0062135 A1 | 4/2004 | Itakura | |
| 2010/0293406 A1 | 11/2010 | Welker | |
| 2014/0177314 A1 | 6/2014 | Chu | |
| 2016/0269026 A1 * | 9/2016 | Mochida | H03K 19/0008 |

FOREIGN PATENT DOCUMENTS

| | | |
|---|---|---|
| CN | 1761886 A | 4/2006 |
| CN | 102422360 A | 4/2012 |
| CN | 103886912 A | 6/2014 |
| CN | 213459060 U | 6/2021 |

* cited by examiner

*Primary Examiner* — Tuan T Nguyen
(74) *Attorney, Agent, or Firm* — SYNCODA LLC; Feng Ma

(57) ABSTRACT

A memory includes: an input circuit, configured to: receive an outside clock signal, and output a first test clock signal; a test path selection circuit, connected to the input circuit, and configured to output a second test clock signal according to a read clock command; and an output circuit, connected to the test path selection circuit, and configured to convert the second test clock signal into a third test clock signal and output the third test clock signal to outside of the memory. In the embodiments of the disclosure, a time delay of inputting a clock signal into each chip under test is quantified, to acquire an actual output delay of the chip, thereby improving the accuracy of parallel tests of a plurality of chips.

18 Claims, 5 Drawing Sheets

MEMORY, MEMORY TEST SYSTEM, AND MEMORY TEST METHOD

CROSS-REFERENCE TO RELATED APPLICATIONS

This is a continuation of International Application No. PCT/CN2021/112344 filed on Aug. 12, 2021, which claims priority to Chinese patent application No. 202011166903.9 filed on Oct. 27, 2020. The disclosures of these applications are hereby incorporated by reference in their entirety.

BACKGROUND

An objective of a semiconductor chip test is to screen out a semiconductor chip with product performance that does not conform to expected performance. A semiconductor chip may have inadequate performance due to many factors. For example, a manufacturing process error occurs in a manufacturing process of a semiconductor chip, thus an output delay of the semiconductor chip is caused not to conform to expected performance.

SUMMARY

The disclosure relates to, but not limited to, a memory, a memory test system, and a memory test method.

Embodiments of the disclosure provide a memory, including: an input circuit, configured to: receive an outside clock signal, and output a first test clock signal; a test path selection circuit, connected to the input circuit, and configured to output a second test clock signal according to a read clock command; and an output circuit, connected to the test path selection circuit, and configured to convert the second test clock signal into a third test clock signal and output the third test clock signal to outside of the memory.

The embodiments of the disclosure further provide a memory test system, including: a plurality of memories numbered 1 to N, N being an integer greater than or equal to 2, where each of the memories includes an input circuit, configured to: receive an outside clock signal, and output a first test clock signal, a test path selection circuit, connected to the input circuit, and configured to output a second test clock signal according to a read clock command, and an output circuit, connected to the test path selection circuit, and configured to convert the second test clock signal into a third test clock signal and output the third test clock signal to outside of the memory; and a test card, configured to: output address information, command information, a zeroth test clock signal and chip select information to each of the memories numbered 1 to N, and receive data information from the memories numbered 1 to N.

The embodiments of the disclosure further provide a memory test method, including: outputting, by a test card, address information, command information, a zeroth test clock signal and chip select information to each of memories sequentially numbered 1 to N, and receiving data information from the memories numbered 1 to N, N being an integer greater than or equal to 2, where the data information outputted by each memory includes main path delay information and test path delay information, the test card sequentially numbers the main path delay information received from the memories numbered 1 to N as first main path delay information to $N^{th}$ main path delay information, and the test card sequentially numbers the test path delay information received from the memories numbered 1 to N as first test path delay information to $N^{th}$ test path delay information; and sequentially defining that a first actual main path delay to an $N^{th}$ actual main path delay correspond to actual main path delays of the memories numbered 1 to N, where the first actual main path delay is equal to a delay represented by the first main path delay information, and a difference between a delay represented by $M^{th}$ test path delay information and a delay represented by the first test path delay information is taken as being equal to a clock offset value, then an $M^{th}$ actual main path delay is equal to a difference obtained by subtracting the clock offset value from a delay represented by $M^{th}$ main path delay information, where M is an integer greater than 1 and less than or equal to N.

BRIEF DESCRIPTION OF THE DRAWINGS

One or more embodiments are exemplarily described by using a diagram that corresponds to the one or more embodiments in the accompanying drawings. Unless specifically indicated, the diagrams in the accompanying drawings do not constitute any limitations on proportions.

DETAILED DESCRIPTION

A semiconductor chip test method is generally performed through parallel tests of a plurality of chips, to reduce a time taken for testing. During the parallel tests of the plurality of chips, a chip test card simultaneously tests hundreds and thousands of chips on one wafer.

To save test resources, one same clock signal is used for the chips in the parallel tests. There are different time delays when the clock signal is inputted into the chips under test. As a result, output delays of the chips acquired from the tests cannot represent actual output delays of the chips, thus a problem is caused that results of the parallel tests of the plurality of chips are inaccurate.

Figure 5:
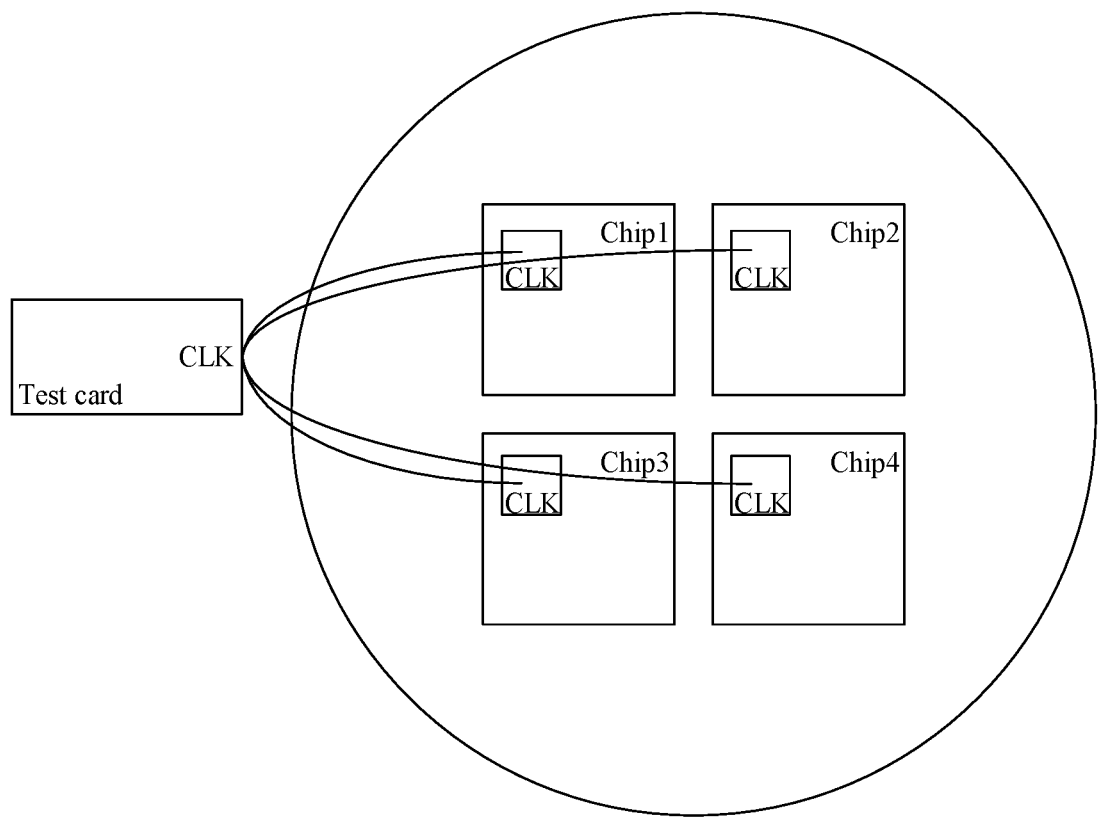
FIG. 5 is a schematic diagram of a clock signal delay of a test card.

A semiconductor chip test method is generally performed through parallel tests of a plurality of chips, to reduce a time taken for testing. During the parallel tests of the plurality of chips, a chip test card simultaneously tests hundreds and thousands of chips on one wafer. To save test resources, one same clock signal is used for the chips in the parallel tests. There are different time delays when the clock signal is inputted into the chips under test. As a result, output delays of the chips acquired from the tests cannot represent actual output delays of the chips, thus a problem is caused that results of the parallel tests of the plurality of chips are inaccurate. Referring to FIG. 5, a delay exists from a clock terminal CLK of a test card to a clock terminal CLK of Chip1, and is, for example, 0.5 ns, and a delay exists when a signal is from the clock terminal CLK of the test card to a clock terminal CLK of Chip2, and is, for example, 0.9 ns. The delay from the clock terminal CLK of the test card to the clock terminal CLK of Chip1 is 0 by default. Thus, an offset between 0.5 ns and 0.9 ns is a clock offset value of Chip2 during the parallel tests. The clock offset value is 0.9 ns–0.5 ns=0.4 ns.

This embodiment provides a memory, including: an input circuit, configured to: receive an outside clock signal, and output a first test clock signal; a test path selection circuit, connected to the input circuit, and configured to output a second test clock signal according to a read clock command; and an output circuit, connected to the test path selection circuit, and configured to convert the second test clock signal into a third test clock signal and output the third test clock signal to outside of the memory.

For clearer descriptions of the objectives, technical solutions, and advantages of the embodiments of the disclosure, the embodiments of the disclosure are described in detail hereinafter with reference to the accompanying drawings. However, it is understandable to those of ordinary skill in the art that many technical details are provided for a reader to better understand the disclosure in the embodiments of the disclosure. However, even in the absence of these technical details and various changes and modifications based on the following embodiments, the technical solution claimed in the disclosure may be implemented. The divisions in the following embodiments are for ease of description but should not constitute any limitation to specific embodiments of the disclosure. Various embodiments may be combined with each other or used as references for each other without causing any conflict.

Figure 1:
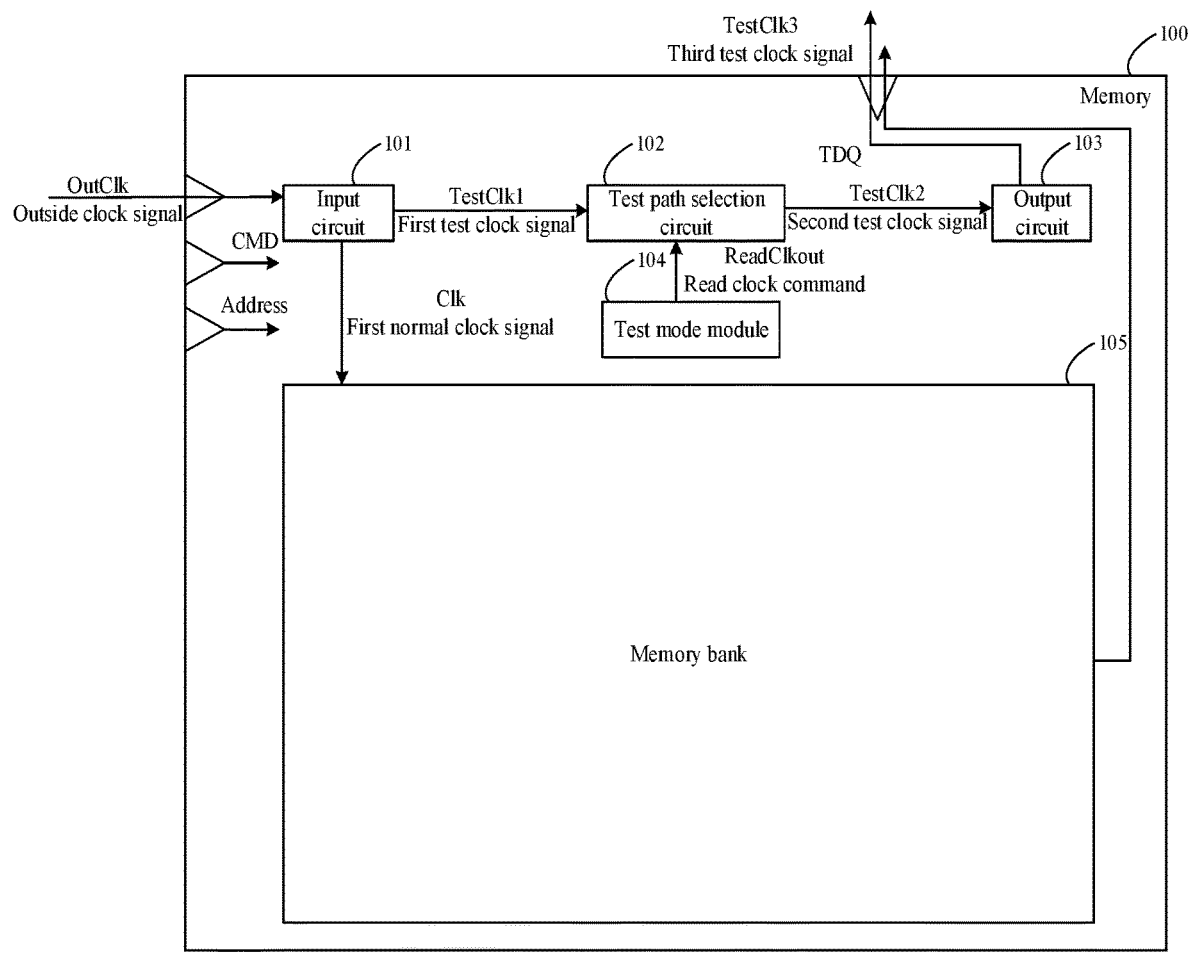
FIG. 1 is a schematic diagram of a memory according to an embodiment of the disclosure.
Figure 2:
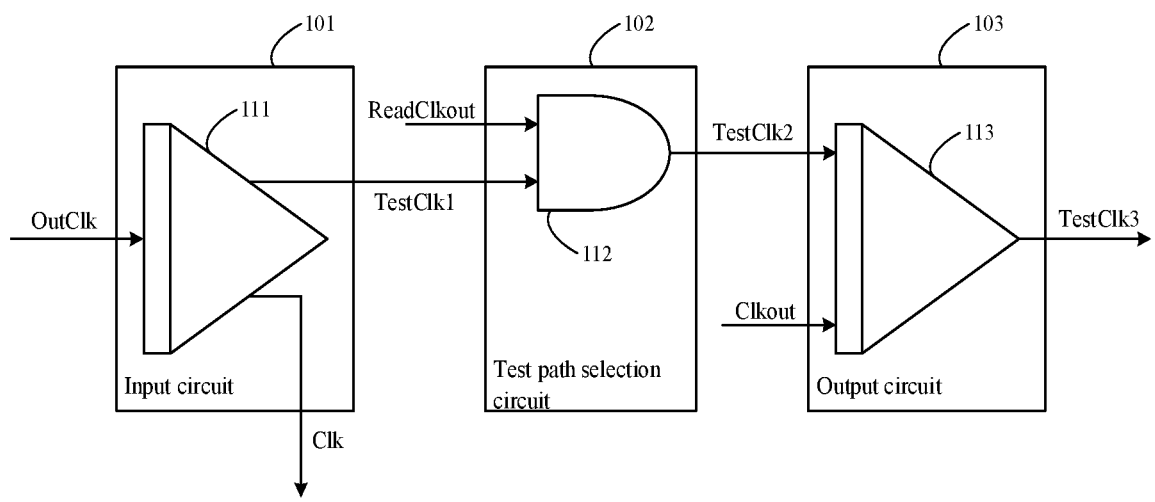
FIG. 2 is a schematic diagram of a circuit structure of a memory according to an embodiment of the disclosure.

FIG. 1 is an optional schematic diagram of a memory according to an embodiment of the disclosure. FIG. 2 is an optional schematic diagram of a circuit structure of a memory according to an embodiment of the disclosure. The memory in the embodiments of the disclosure is specifically described below.

Referring to FIG. 1, a memory 100 includes an input circuit 101, a test path selection circuit 102, and an output circuit 103.

The input circuit 101 is configured to: receive an outside clock signal OutClk, and output a first test clock signal TestClk1. The outside clock signal OutClk is a clock signal provided by an external device to the memory 100. The outside clock signal OutClk is a normal operation signal or a test signal of the memory 100. The first test clock signal TestClk1 is a clock signal inputted into the test path selection circuit 102. A frequency of the first test clock signal TestClk1 is the same as a frequency of the outside clock signal OutClk.

A delay between the first test clock signal TestClk1 and the outside clock signal OutClk is represented by input circuit delay information.

The test path selection circuit 102 is connected to the input circuit 101, and is configured to output a second test clock signal TestClk2 according to a read clock command ReadClkout. The second test clock signal TestClk2 is a clock signal input into the output circuit 103.

In the embodiments of the disclosure, the memory 100 further includes a test mode circuit 104. The test mode circuit 104 is configured to output the read clock command ReadClkout. The memory 100 outputs the read clock command ReadClkout based on received command information, to turn on the test path selection circuit 102.

The read clock command ReadClkout is a turn-on signal of the test path selection circuit 102. When the read clock command ReadClkout is at a high level, the test path selection circuit 102 outputs the second test clock signal TestClk2 according to the first test clock signal TestClk1. When the read clock command ReadClkout is at a low level, the second test clock signal TestClk2 outputted by the test path selection circuit 102 is at a low level. When the read clock command ReadClkout is at a high level, a frequency of the second test clock signal TestClk2 is the same as a frequency of the first test clock signal TestClk1.

A delay between the second test clock signal TestClk2 and the first test clock signal TestClk1 is represented by test path selection circuit delay information.

The output circuit 103 is connected to the test path selection circuit 102, and is configured to convert the second test clock signal TestClk2 into a third test clock signal TestClk3 and output the third test clock signal to outside of the memory 100. The third test clock signal TestClk3 is a clock signal outputted to the outside of the memory 100.

A delay between the third test clock signal TestClk3 and of the second test clock signal TestClk2 is represented by output circuit delay information.

The input circuit 101, the test path selection circuit 102 and the output circuit 103 are used as a first data path, for directly outputting the received outside clock signal OutClk. The input circuit delay information, the test path selection circuit delay information and the output circuit delay information together form test path delay information of the memory 100.

In the embodiments of the disclosure, the memory 100 further includes a memory bank 105. The memory bank 105 is a storage unit configured to store data in the memory 100. The input circuit 101 is further configured to output a first normal clock signal Clk. The first normal clock signal Clk is a clock source used for performing a read/write operation on the memory bank 105. A frequency and a phase of the first normal clock signal Clk are respectively the same as a frequency and a phase of the first test clock signal TestClk1.

Figure 3:
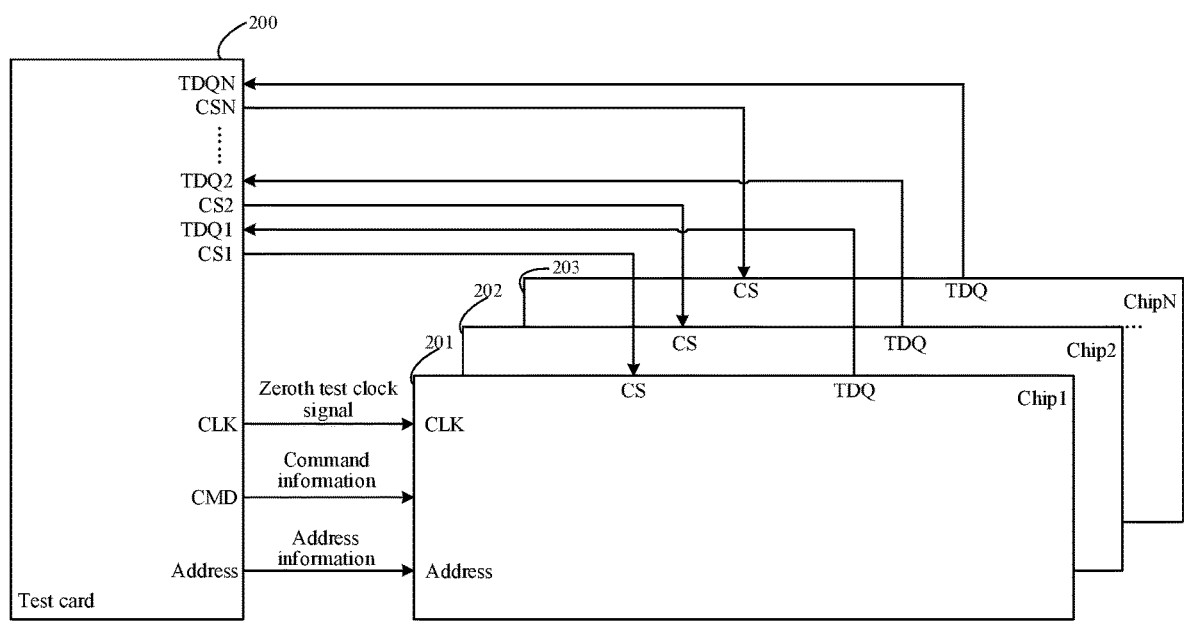
FIG. 3 is a schematic structural diagram of a memory test system according to an embodiment of the disclosure.

Referring to FIG. 1 and FIG. 3, the memory 100 in FIG. 1 may be any one of a memory 1 (Chip 1, 201) to a memory N (ChipN, 203), and receives address information Address, command information CMD, a zeroth test clock signal TestClk0 and a chip select signal that are transmitted by a test card 200. The memory bank 105 operates based on the first normal clock signal Clk. The memory 100 performs a read operation based on the received command information CMD and reads data from the memory bank 105. The data is outputted to the test card 200 by using a TDQ terminal of the memory. The test card acquires main data path delay information of the memory 100 by using a time interval between transmitting the zeroth test clock signal TestClk0 to the memory 100 and receiving the read data. The input circuit delay information, a time taken for performing the read/write operation on the memory bank and the output circuit delay information together form main path delay information of the memory 100.

The test card 200, the input circuit 101, and the memory bank 105 are used as a second data path, used for providing the outside clock signal OutClk to the memory bank 105 for normal operation of the memory 100.

In the embodiments of the disclosure, the test card 200 provides the zeroth test clock signal TestClk0 and the command information CMD to the memory 100. The input circuit 101 transmits the first normal clock signal Clk based on the zeroth test clock signal TestClk0. The memory bank 105 reads the data based on the first normal clock signal Clk. The memory 100 transmits the data read from the memory bank 105 back to the test card 200 by using an output terminal TDQ. That is, the test card 200, the input circuit 101, and the memory bank 105 are used as a second data path, used for acquiring the main path delay information of the memory 100.

In some embodiments of the disclosure, referring to FIG. 2, the input circuit 101 includes a receiving circuit 111. The receiving circuit 111 is configured to generate the first test clock signal TestClk1 and the first normal clock signal Clk according to the outside clock signal OutClk. A frequency of the first test clock signal TestClk1 is the same as a frequency of the outside clock signal OutClk. A frequency and phase of the first test clock signal TestClk1 are respectively the same as a frequency and phase of the first normal clock signal Clk.

In some embodiments of the disclosure, referring to FIG. 2, the test path selection circuit 102 includes an AND gate structure 112. Two input terminals of the AND gate structure 112 are respectively configured to receive the read clock command ReadClkout and the first test clock signal TestClk1. When the read clock command ReadClkout is at a high level, the test path selection circuit 102 outputs the second test clock signal TestClk2 according to the first test clock signal TestClk1. A frequency of the second test clock signal TestClk2 is the same as a frequency of the first test clock signal TestClk1. When the read clock command ReadClkout is at a low level, the second test clock signal TestClk2 outputted by the test path selection circuit 102 is at a low level.

In some embodiments of the disclosure, referring to FIG. 2, the output circuit 103 includes a transmit circuit 113. The transmit circuit 113 is configured to convert the second test clock signal TestClk2 into the third test clock signal TestClk3 and output the third test clock signal to outside of the memory 100. That is, the input circuit 101, the test path selection circuit 102 and the output circuit 103 are used as the first data path, used for directly outputting the received outside clock signal OutClk.

In the embodiments of the disclosure, referring to FIG. 1, the memory bank 105 operates based on the first normal clock signal Clk. The memory 100 performs a read operation based on the command information CMD, to read the data from the memory bank 105. The test card acquires the main data path delay information of the memory 100 by using a time interval between transmitting the clock signal to a storage region and receiving the read data.

In the embodiments of the disclosure, the test path delay information and the main path delay information of the memory 100 are acquired based on the input circuit delay information, the output circuit delay information, the test path selection circuit delay information, and the time taken for performing the read/write operation on the memory bank of the memory 100. The input circuit delay information, the test path selection circuit delay information and the output circuit delay information together form the test path delay information of the memory 100. The input circuit delay information, the time taken for performing the read/write operation on the memory bank and the output circuit delay information together form the main path delay information of the memory 100.

It may be understood that, the input circuit, the test path selection circuit and the output circuit form a direct output circuit. The direct output circuit directly outputs the third test clock signal based on the outside clock signal, thereby acquiring a time delay when an external signal is inputted into the memory, to avoid an error caused by different time delays when a clock signal is inputted into chips under test, so as to improve the accuracy of parallel tests of a plurality of chips.

It should be noted that the modules in the embodiments of the disclosure are all logic modules. In an actual application, one logic unit may be one physical unit, or may be a part of a physical unit, or may further be implemented by using a combination of a plurality of physical units. In addition, to highlight the innovative parts of the disclosure, units that are not closely related to the solving of the technical problems discussed in the disclosure are not introduced in the embodiments of the disclosure. However, this does not indicate that other units do not exist in the embodiments of the disclosure.

FIG. 3 is an optional schematic structural diagram of a memory test system according to an embodiment of the disclosure. The memory test system in the embodiments of the disclosure is described below in detail with reference to the accompanying drawings, and parts that are the same as or correspond to the foregoing content. Details are not described hereinafter.

Referring to FIG. 3, the memory test system includes: the plurality of memories provided in the foregoing embodiments, the memories being sequentially numbered 1 to N, N being an integer greater than or equal to 2, and being, for example, a memory 1 (Chip1, 201), a memory 2 (Chip2, 202), . . . , and a memory N (ChipN, 203); and a test card 200, configured to: output address information Address, command information CMD, a zeroth test clock signal TestClk0 and a chip select signal to each of the memories numbered 1 to N, and receive data information from the memories numbered 1 to N.

The memories numbered 1 to N share the address information Address, the command information CMD, and the zeroth test clock signal TestClk0 outputted by the test card 200.

The test card 200 has N chip select output terminals configured to output chip select information and N data receiving terminals configured to receive the data information, and both the N chip select output terminals and the N data receiving terminals are connected in one-to-one correspondence with the memories numbered 1 to N.

In the embodiments of the disclosure, the test card establishes a data transmission loop with the memory 1 (Chip1, 201) through a first chip select output terminal CS1 and a first data receiving terminal TDQ1. The data information of the memory 1 (Chip1, 201) is fed back to the test card 200 through the first data receiving terminal TDQ1. A data transmission closed loop is formed between test card 200 and the memory 1 (Chip1, 201) through the first chip select output terminal CS1 and the first data receiving terminal TDQ1. That is, data transmissions between the memories numbered 1 to N and the test card 200 do not affect each other.

Referring to FIG. 1 and FIG. 3, the zeroth test clock signal TestClk0 of the test card 200 is delivered to input circuits 101 of the memories. The memories deliver the third test clock signals TestClk3 and the data stored in the memory bank 105 to respective data receiving terminals of the test card 200. The zeroth test clock signal TestClk0 is the outside clock signal OutClk inputted into the memory. The zeroth test clock signal TestClk0 is a normal operation signal and a test signal of the memory 100. The memory test system acquires the test path delay information of the memory according to the third test clock signal TestClk3 fed back by the memory, and acquires main path delay information of the memory according to the data stored in the memory bank 105 fed back by the memory. Correspondingly, the memory test system acquires a clock offset value corresponding to each memory according to the acquired main path delay information and test path delay information fed back by the memories numbered 1 to N, the clock offset value of the memory numbered $N=N^{th}$ test path delay information-first test path delay information, an $N^{th}$ actual main path delay of the memory numbered $N=N^{th}$ main path delay information-the clock offset value.

It may be understood that, the memories numbered 1 to N are tested in parallel by using the same test card. Each of the memories numbered 1 to N includes the foregoing direct output circuit, configured to output a third test clock signal based on the zeroth test clock signal provided by the test card, to acquire a time delay when the zeroth test clock signal is inputted into the memory, thereby avoiding an error caused by different time delays when the zeroth test clock signal is inputted into chips under test, so as to improve the accuracy of parallel tests of a plurality of chips performed by using the test card.

It should be noted that the modules in the embodiments of the disclosure are all logic modules. In an actual application, one logic unit may be one physical unit, or may be a part of a physical unit, or may further be implemented by using a combination of a plurality of physical units. In addition, to highlight the innovative parts of the disclosure, units that are not closely related to the solving of the technical problems discussed in the disclosure are not introduced in the embodiments of the disclosure. However, this does not indicate that other units do not exist in the embodiments of the disclosure.

Some embodiments of the disclosure relate to a memory test method.

The memory test method includes: outputting, by a test card, address information, command information, a zeroth test clock signal and chip select information to each of memories sequentially numbered 1 to N, and receiving data information from the memories numbered 1 to N, N being an integer greater than or equal to 2, where the data information outputted by each memory includes main path delay information and test path delay information, the test card sequentially numbers the main path delay information received from the memories numbered 1 to N as first main path delay information to $N^{th}$ main path delay information, and the test card sequentially numbers the test path delay information received from the memories numbered 1 to N as first test path delay information to $N^{th}$ test path delay information; and sequentially defining that a first actual main path delay to an $N^{th}$ actual main path delay correspond to actual main path delays of the memories numbered 1 to N, where the first actual main path delay is equal to a delay represented by the first main path delay information, and a difference between a delay represented by $M^{th}$ test path delay information and a delay represented by the first test path delay information is taken as being equal to a clock offset value, then an $M^{th}$ actual main path delay is equal to a difference obtained by subtracting the clock offset value from a delay represented by $M^{th}$ main path delay information, where M is an integer greater than 1 and less than or equal to N.

Figure 4:
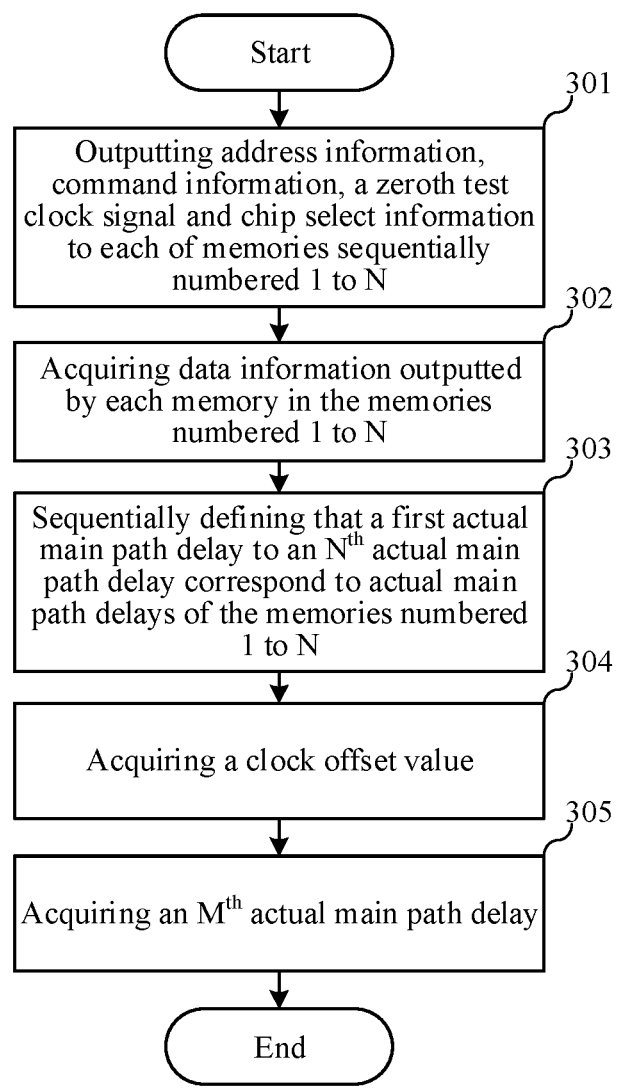
FIG. 4 is a schematic flowchart of a memory test method according to an embodiment of the disclosure.

FIG. 4 is an optional schematic flowchart of a memory test method according to some embodiments of the disclosure. The memory test method in the embodiments of the disclosure are described below in detail with reference to the accompanying drawings, and parts that are the same as or correspond to the foregoing content. Details are not described hereinafter.

Referring to FIG. 4, the memory test method includes the following steps.

In step 301, address information, command information, a zeroth test clock signal and chip select information are outputted to each of memories sequentially numbered 1 to N.

In the embodiments of the disclosure, referring to FIG. 3, the test card 200 outputs address information Address, command information CMD, a zeroth test clock signal TestClk0 and chip select information to the memories sequentially numbered 1 to N, N being an integer greater than or equal to 2.

The test card 200 has N chip select output terminals configured to output the chip select information and N data receiving terminals configured to receive the data information, and both the N chip select output terminals and the N data receiving terminals are connected in one-to-one correspondence with the memories numbered 1 to N.

The memories numbered 1 to N share the address information Address, the command information CMD, and the zeroth test clock signal TestClk0 outputted by the test card 200. The zeroth test clock signal TestClk0 is an outside clock signal inputted into the memory.

In step 302, data information outputted by each memory in the memories numbered 1 to N is acquired.

In the embodiments of the disclosure, referring to FIG. 3, the test card 200 receives the data information of the memories numbered 1 to N. The data information outputted by each memory includes main path delay information and test path delay information. The test card sequentially numbers the main path delay information received from the memories numbered 1 to N as first main path delay information to $N^{th}$ main path delay information. The test card sequentially numbers the test path delay information received from the memories numbered 1 to N as first test path delay information to $N^{th}$ test path delay information.

Referring to FIG. 1, the memory 100 includes: an input circuit 101, configured to: receive the zeroth test clock signal TestClk0, and output a first test clock signal TestClk1 and a first normal clock signal Clk, a delay of the first test clock signal TestClk1 relative to the zeroth test clock signal TestClk0 being input circuit delay information; a test path selection circuit 102, connected to the input circuit 101, and configured to output a second test clock signal TestClk2 according to a read clock command ReadClkout, a delay of the second test clock signal TestClk2 relative to the first test clock signal TestClk1 being test path selection circuit delay information; and an output circuit 103, connected to the test path selection circuit 102, and configured to convert the second test clock signal TestClk2 into a third test clock signal TestClk3 and output the third test clock signal TestClk3 to the test card 200, a delay of the third test clock signal TestClk3 relative to the second test clock signal TestClk2 being output circuit delay information.

In the embodiments of the disclosure, the input circuit 101 is configured to: receive the zeroth test clock signal TestClk0, and output the first test clock signal TestClk1. The input circuit 101 is further configured to output the first normal clock signal Clk according to the zeroth test clock signal TestClk0. A delay between the first test clock signal TestClk1 of the zeroth test clock signal TestClk0 is represented by the input circuit delay information.

The test path selection circuit 102 is configured to output the second test clock signal TestClk2 according to the read clock command ReadClkout. A delay between the second test clock signal TestClk2 and the first test clock signal TestClk1 is represented by the test path selection circuit delay information.

In the embodiments of the disclosure, the memory 100 further includes a test mode circuit 104. The test mode circuit is configured to receive the command information CMD. The test mode circuit 104 is further configured to output the read clock command ReadClkout. The memory 100 is configured to output the read clock command ReadClkout based on the received command information CMD, to turn on the test path selection circuit 102. When the read clock command ReadClkout is at a high level, the test path selection circuit 102 outputs the second test clock signal TestClk2 according to the first test clock signal TestClk1. When the read clock command ReadClkout is at a low level, the second test clock signal TestClk2 outputted by the test path selection circuit 102 is at a low level.

The output circuit 103 is configured to convert the second test clock signal TestClk2 into the third test clock signal TestClk3 and output the third test clock signal to outside of the memory 100. A delay between the third test clock signal TestClk3 and the second test clock signal TestClk2 is represented by the output circuit delay information.

In the embodiments of the disclosure, the test path delay information includes the input circuit delay information, the test path selection circuit delay information, and the output circuit delay information.

The memory 100 further includes a memory bank 105. The first normal clock signal Clk is a clock source used for performing a read/write operation on the memory bank 105. A frequency and a phase of the first normal clock signal Clk are respectively the same as a frequency and a phase of the first test clock signal TestClk1.

The memory bank 105 operates based on the first normal clock signal Clk. The memory 100 performs a read operation based on the command information CMD, to read the data from the memory bank 105. The test card acquires main data path delay information of the memory 100 by using a time interval between transmitting the clock signal to a storage region and receiving the read data.

In the embodiments of the disclosure, the test card 200 in FIG. 3 may provide the zeroth test clock signal TestClk0 and the command information CMD to the memory 100 in FIG. 1. The input circuit 101 transmits the first normal clock signal Clk based on the zeroth test clock signal TestClk0. The memory bank 105 reads the data based on the first normal clock signal Clk. The memory 100 transmits the data read from the memory bank 105 back to the test card 200 by using TDQ. That is, the test card 200, the input circuit 101, and the memory bank 105 are used as a second data path, used for acquiring the main path delay information of the memory 100.

In the embodiments of the disclosure, the main path delay information includes the input circuit delay information, a time taken for performing the read/write operation on the memory bank, and the output circuit delay information.

In step 303, it is sequentially defined that a first actual main path delay to an $N^{th}$ actual main path delay correspond to actual main path delays of the memories numbered 1 to N. In step 304, a clock offset value is acquired. In step 305, an $M^{th}$ actual main path delay is acquired.

In the embodiments of the disclosure, the first actual main path delay is equal to a delay represented by the first main path delay information. Correspondingly, the $N^{th}$ actual main path delay is equal to a delay represented by the $N^{th}$ main path delay information.

A difference between a delay represented by $M^{th}$ test path delay information and a delay represented by the first test path delay information is taken as being equal to a clock offset value, then the $M^{th}$ actual main path delay is equal to a difference obtained by subtracting the clock offset value from a delay represented by $M^{th}$ main path delay information, where M is an integer greater than 1 and less than or equal to N.

For the memory N (ChipN, 203), a difference between the $N^{th}$ test path delay information of the memory N (ChipN, 203) and the first test path delay information is equal to the clock offset value, and the $N^{th}$ actual main path delay is equal to a difference obtained by subtracting the clock offset value from the a delay represented by $N^{th}$ main path delay information.

The data information fed back by the memory includes the data information shown in Table 1 and Table 2:

TABLE 1

| $N^{th}$ main path delay information | Zeroth test clock signal delay | $D0_N$ | $Z_N$ |
|---|---|---|---|
| | Input circuit delay information | $D1_N$ | |
| | Time taken for performing the read/write operation on the memory bank | $D2_N$ | |
| | Output circuit delay information | $D3_N$ | |
| $N^{th}$ test path delay information | Zeroth test clock signal delay | $D0_N$ | $C_N$ |
| | Input circuit delay information | $D1_N$ | |
| | Test path selection circuit delay information | $D4_N$ | |
| | Output circuit delay information | $D3_N$ | |
| Clock offset value | $N^{th}$ test path delay information - first test path delay information | | |
| $N^{th}$ actual main path delay | $N^{th}$ main path delay information - clock offset value | | |

TABLE 2

| | Main path delay information | Test path delay information | Clock offset value |
|---|---|---|---|
| Memory 1 (Chip1, 201) | $Z_1$ | $C_1$ | / |
| Memory 2 (Chip2, 202) | $Z_2$ | $C_2$ | $C_2 - C_1$ |
| ... | ... | ... | ... |
| Memory N (ChipN, 203) | $Z_N$ | $C_N$ | $C_N - C_1$ |

A clock offset value corresponding to each memory is acquired according to the acquired test path delay information separately fed back by the memories numbered 1 to N. For example, the clock offset value of the memory numbered N=the $N^{th}$ test path delay information—the first test path delay information, that is, $t=C_N-C_1$.

The actual main path delay corresponding to each memory is acquired according to the acquired main path delay information separately fed back by the memories numbered 1 to N. For example, the actual main path delay of the memory numbered N=the $N^{th}$ main path delay information–the clock offset value, that is, $T_N=Z_N-t$.

For example, FIG. 3 is used as an example for reference. For the chip numbered 1, a zeroth test clock signal delay $D0_1$ is 0.2 ns, input circuit delay information $D1_2$ is 0.4 ns, test path selection circuit delay information $D4_2$ is 0.3 ns, and output circuit delay information $D3_2$ is 0.5 ns. That is, first test path delay information $C_1$ of the chip numbered 1 is 1.4 ns. For example, N is equal to 2. For the chip numbered 2, a zeroth test clock signal delay $D0_2$ is 0.5 ns, the input circuit delay information $D1_2$ is 0.5 ns, test path selection circuit delay information $D4_2$ is 0.2 ns, and the output circuit delay information $D3_2$ is 0.4 ns. That is, second test path delay information $C_2$ of the chip numbered 2 is 1.6 ns. In this case, a clock offset value t of the memory numbered 2 is 0.2 ns. If acquired second main path delay information $Z_2$ of the chip numbered 2 is 15 ns, a second actual main path delay $T_2$ of the chip numbered 2 is 14.8 ns.

It is to be understood that, the test card provides a zeroth test clock signal to the memory, the memory feeds back the main path delay information and the test path delay information. The actual main path delay of the memory is acquired based on the main path delay information. The difference between the a delay represented by $M^{th}$ test path delay information and a delay represented by the first test path delay information is taken as being the clock offset value. The actual main path delay is acquired based on the main path delay information and the clock offset value, to avoid an error caused by different time delays when a clock signal is inputted into chips under test, thereby improving the accuracy of parallel tests of a plurality of chips.

Various divisions of steps above are merely for clear description, and the steps can be merged into one step or some steps can be divided into a plurality of steps during implementation, as long as the same logic relationship is included, all of which shall fall within the scope of protection of the patent. All the added insignificant modifications or introduced insignificant designs in a procedure without changing the core design of the procedure of the patent shall fall within the scope of protection of the patent.

A person of ordinary skill in the art may understand that the foregoing embodiments are specific embodiments for implementing the disclosure, and in actual applications, various changes can be made thereto in forms and details without departing from the spirit and scope of the disclosure.

INDUSTRIAL APPLICABILITY

Embodiments of the disclosure provide a memory, a memory test system, and a memory test method. The memory includes: an input circuit, configured to: receive an outside clock signal, and output a first test clock signal; a test path selection circuit, connected to the input circuit, and configured to output a second test clock signal according to a read clock command; and an output circuit, connected to the test path selection circuit, and configured to convert the second test clock signal into a third test clock signal and output the third test clock signal to outside of the memory. It may be understood that, the input circuit, the test path selection circuit and the output circuit form a direct output circuit. The direct output circuit directly outputs the third test clock signal based on the outside clock signal, thereby acquiring a time delay when an external signal is inputted into the memory, to avoid an error caused by different time delays when a clock signal is inputted into chips under test, so as to improve the accuracy of parallel tests of a plurality of chips.

The memory test system includes: the plurality of memories in the foregoing, the memories being sequentially numbered 1 to N, N being an integer greater than or equal to 2; and a test card, configured to: output address information, command information, a zeroth test clock signal and chip select information to each of the memories numbered 1 to N, and receive data information from the memories numbered 1 to N. It may be understood that, the memories numbered 1 to N are tested in parallel by using the same test card. Each of the memories numbered 1 to N includes the foregoing direct output circuit, configured to output a third test clock signal based on the zeroth test clock signal provided by the test card, to acquire a time delay when the zeroth test clock signal is inputted into the memory, thereby avoiding an error caused by different time delays when the zeroth test clock signal is inputted into chips under test, so as to improve the accuracy of parallel tests of a plurality of chips performed by using the test card.

The memory test method includes: outputting, by a test card, address information, command information, a zeroth test clock signal and chip select information to each of memories sequentially numbered 1 to N, and receiving data information from the memories numbered 1 to N, N being an integer greater than or equal to 2, where the data information outputted by each memory includes main path delay information and test path delay information, the test card sequentially numbers the main path delay information received from the memories numbered 1 to N as first main path delay information to $N^{th}$ main path delay information, and the test card sequentially numbers the test path delay information received from the memories numbered 1 to N as first test path delay information to $N^{th}$ test path delay information; and sequentially defining that a first actual main path delay to an $N^{th}$ actual main path delay correspond to actual main path delays of the memories numbered 1 to N, where the first actual main path delay is equal to a delay represented by the first main path delay information, and a difference between a delay represented by $M^{th}$ test path delay information and a delay represented by the first test path delay information is taken as being equal to a clock offset value, then an $M^{th}$ actual main path delay is equal to a difference obtained by subtracting the clock offset value from a delay represented by $M^{th}$ main path delay information, where M is an integer greater than 1 and less than or equal to N. It may be understood that, the test card provides the zeroth test clock signal to the memory. The memory feeds back the main path delay information and the test path delay information. The actual main path delays of the memory is acquired based on the main path delay information. The difference between a delay represented by the $M^{th}$ test path delay information and a delay represented by the first test path delay information is taken as being equal to the clock offset value. The actual main path delays are acquired based on the main path delay information and the clock offset value, to avoid an error caused by different time delays when a clock signal is inputted into chips under test, thereby improving the accuracy of parallel tests of a plurality of chips.

What is claimed is:

1. A memory, comprising:
   an input circuit, configured to: receive an outside clock signal, and output a first test clock signal;
   a test path selection circuit, connected to the input circuit, and configured to output a second test clock signal according to a read clock command; and
   an output circuit, connected to the test path selection circuit, and configured to convert the second test clock signal into a third test clock signal and output the third test clock signal to outside of the memory,
   wherein the input circuit is further configured to output a first normal clock signal, and a frequency and a phase of the first normal clock signal are respectively the same as a frequency and a phase of the first test clock signal.

2. The memory of claim 1, further comprising a memory bank, wherein the first normal clock signal is a clock source used for performing a read/write operation on the memory bank.

3. The memory of claim 1, wherein a frequency of the first test clock signal is the same as a frequency of the outside clock signal.

4. The memory of claim 1, wherein when the read clock command is at a low level, the second test clock signal outputted by the test path selection circuit is at a low level; and when the read clock command is at a high level, a frequency of the second test clock signal outputted by the test path selection circuit is the same as a frequency of the first test clock signal.

5. The memory of claim 1, further comprising a test mode circuit, configured to output the read clock command.

6. A memory test system, comprising:
   a plurality of memories sequentially numbered 1 to N, N being an integer greater than or equal to 2, wherein each of the memories comprises:
an input circuit, configured to: receive an outside clock signal, and output a first test clock signal,
a test path selection circuit, connected to the input circuit, and configured to output a second test clock signal according to a read clock command, and
an output circuit, connected to the test path selection circuit, and configured to convert the second test clock signal into a third test clock signal and output the third test clock signal to outside of the memory; and
a test card, configured to: output address information, command information, a zeroth test clock signal and chip select information to each of the memories numbered 1 to N, and receive data information from the memories numbered 1 to N.

7. The memory test system of claim 6, wherein the input circuit is further configured to output a first normal clock signal, and a frequency and a phase of the first normal clock signal are respectively the same as a frequency and a phase of the first test clock signal.

8. The memory test system of claim 7, wherein each of the memories further comprises a memory bank, wherein the first normal clock signal is a clock source used for performing a read/write operation on the memory bank.

9. The memory test system of claim 6, wherein a frequency of the first test clock signal is the same as a frequency of the outside clock signal.

10. The memory test system of claim 6, wherein when the read clock command is at a low level, the second test clock signal outputted by the test path selection circuit is at a low level; and when the read clock command is at a high level, a frequency of the second test clock signal outputted by the test path selection circuit is the same as a frequency of the first test clock signal.

11. The memory test system of claim 6, wherein each of the memories further comprises a test mode circuit, configured to output the read clock command.

12. The memory test system of claim 6, wherein the test card has N chip select output terminals configured to output the chip select information and N data receiving terminals configured to receive the data information, and both the N chip select output terminals and the N data receiving terminals are connected in one-to-one correspondence with the memories numbered 1 to N.

13. The memory test system of claim 12, wherein the memories numbered 1 to N share the address information, the command information and the zeroth test clock signal that are outputted by the test card.

14. The memory test system of claim 13, wherein the zeroth test clock signal of the test card is delivered to input circuits of the memories, and each of the third test clock signals of the memories is delivered to a respective one of the data receiving terminals of the test card.

15. A memory test method, comprising:
outputting, by a test card, address information, command information, a zeroth test clock signal and chip select information to each of memories sequentially numbered 1 to N, and receiving data information from the memories numbered 1 to N, N being an integer greater than or equal to 2, wherein the data information outputted by each memory comprises main path delay information and test path delay information, the test card sequentially numbers the main path delay information received from the memories numbered 1 to N as first main path delay information to $N^{th}$ main path delay information, and the test card sequentially numbers the test path delay information received from the memories numbered 1 to N as first test path delay information to $N^{th}$ test path delay information; and
sequentially defining that a first actual main path delay to an $N^{th}$ actual main path delay correspond to actual main path delays of the memories numbered 1 to N,
wherein the first actual main path delay is equal to a delay represented by the first main path delay information, and a difference between a delay represented by $M^{th}$ test path delay information and a delay represented by the first test path delay information is taken as being equal to a clock offset value, then an $M^{th}$ actual main path delay is equal to a difference obtained by subtracting the clock offset value from a delay represented by $M^{th}$ main path delay information, where M is an integer greater than 1 and less than or equal to N.

16. The memory test method of claim 15, wherein each memory comprises:
an input circuit, configured to: receive the zeroth test clock signal, and output a first test clock signal and a first normal clock signal, a delay of the first test clock signal relative to the zeroth test clock signal being input circuit delay information;
a test path selection circuit, connected to the input circuit, and configured to output a second test clock signal according to a read clock command, a delay of the second test clock signal relative to the first test clock signal being test path selection circuit delay information; and
an output circuit, connected to the test path selection circuit, and configured to convert the second test clock signal into a third test clock signal and output the third test clock signal to the test card, a delay of the third test clock signal relative to the second test clock signal being output circuit delay information,
wherein the test path delay information comprises the input circuit delay information, the test path selection circuit delay information, and the output circuit delay information.

17. The memory test method of claim 16, wherein the memory further comprises a memory bank, and the first normal clock signal is a clock source used for performing a read/write operation on the memory bank; and the main path delay information comprises the input circuit delay information, a time taken for performing the read/write operation on the memory bank, and the output circuit delay information.

18. The memory test method of claim 17, wherein the memory further comprises a test mode circuit, configured to receive the command information, and the test mode circuit is further configured to output the read clock command.

* * * * *